(12) United States Patent
Huang et al.

(10) Patent No.: US 10,333,001 B2
(45) Date of Patent: Jun. 25, 2019

(54) FIN STRUCTURE OF FINFET

(71) Applicant: Taiwan Semiconductor Manufacturing Company, Ltd., Hsinchu (TW)

(72) Inventors: Gin-Chen Huang, New Taipei (TW); Ching-Hong Jiang, Hsinchu (TW); Neng-Kuo Chen, Hsinchu (TW); Sey-Ping Sun, Hsinchu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/935,212

(22) Filed: Mar. 26, 2018

(65) Prior Publication Data
US 2018/0219095 A1    Aug. 2, 2018

Related U.S. Application Data

(63) Continuation of application No. 15/263,021, filed on Sep. 12, 2016, now Pat. No. 9,929,272, which is a
(Continued)

(51) Int. Cl.
*H01L 29/78* (2006.01)
*H01L 29/66* (2006.01)
(Continued)

(52) U.S. Cl.
CPC ...... *H01L 29/7853* (2013.01); *H01L 21/0217* (2013.01); *H01L 21/02164* (2013.01);
(Continued)

(58) Field of Classification Search
CPC ............. H01L 29/7853; H01L 29/0649; H01L 29/66795; H01L 29/6681; H01L 29/785;
(Continued)

(56) References Cited

U.S. PATENT DOCUMENTS

| 5,312,767 A | 5/1994 | Shimizu et al. |
| 7,071,064 B2 | 7/2006 | Doyle et al. |

(Continued)

FOREIGN PATENT DOCUMENTS

| CN | 1883054 A | 12/2006 |
| CN | 101366122 A | 2/2009 |

(Continued)

*Primary Examiner* — Sitaramarao S Yechuri
(74) *Attorney, Agent, or Firm* — Slater Matsil, LLP

(57) ABSTRACT

A fin structure disposed over a substrate and a method of forming a fin structure are disclosed. The fin structure includes a mesa, a channel disposed over the mesa, and a convex-shaped feature disposed between the channel and the mesa. The mesa has a first semiconductor material, and the channel has a second semiconductor material different from the first semiconductor material. The convex-shaped feature is stepped-shaped, stair-shaped, or ladder-shaped. The convex-shaped feature includes a first isolation feature disposed between the channel and the mesa, and a second isolation feature disposed between the channel and the first isolation feature. The first isolation feature is U-shaped, and the second isolation feature is rectangular-shaped. A portion of the second isolation feature is surrounded by the channel and another portion of the second isolation feature is surrounded by the first isolation feature.

20 Claims, 15 Drawing Sheets

Related U.S. Application Data continuation of application No. 14/793,412, filed on Jul. 7, 2015, now Pat. No. 9,443,964, which is a continuation of application No. 13/730,518, filed on Dec. 28, 2012, now Pat. No. 9,093,530.

(51) Int. Cl.

| | | |
|---|---|---|
| *H01L 21/02* | (2006.01) | |
| *H01L 21/306* | (2006.01) | |
| *H01L 21/762* | (2006.01) | |
| *H01L 29/06* | (2006.01) | |

(52) U.S. Cl.
CPC .. *H01L 21/02532* (2013.01); *H01L 21/30604* (2013.01); *H01L 21/762* (2013.01); *H01L 29/0649* (2013.01); *H01L 29/6681* (2013.01); *H01L 29/66795* (2013.01); *H01L 29/785* (2013.01)

(58) Field of Classification Search
CPC .......... H01L 21/02164; H01L 21/0217; H01L 21/02532; H01L 21/30604; H01L 21/762
See application file for complete search history.

(56) References Cited

U.S. PATENT DOCUMENTS

| | | | |
|---|---|---|---|
| 7,382,001 B2* | 6/2008 | Beach | H01L 29/0623 257/12 |
| 7,772,066 B2 | 8/2010 | Forbes | |
| 8,183,625 B2 | 5/2012 | Forbes | |
| 9,443,964 B2 | 9/2016 | Huang et al. | |
| 2003/0230779 A1* | 12/2003 | Park | H01L 29/0649 257/349 |
| 2005/0064640 A1* | 3/2005 | Park | H01L 29/0649 438/197 |
| 2006/0081876 A1* | 4/2006 | Monfray | H01L 29/0649 257/192 |
| 2006/0160295 A1* | 7/2006 | Kim | H01L 21/761 438/221 |
| 2007/0066019 A1 | 3/2007 | Forbes | |
| 2007/0164373 A1* | 7/2007 | Ko | H01L 29/66545 257/401 |
| 2007/0166901 A1* | 7/2007 | Lee | H01L 29/78603 438/164 |
| 2007/0166927 A1 | 7/2007 | Forbes | |
| 2008/0124893 A1 | 5/2008 | Kim et al. | |
| 2010/0117152 A1 | 5/2010 | Oh | |
| 2011/0049613 A1 | 3/2011 | Yeh et al. | |
| 2011/0074498 A1* | 3/2011 | Thompson | H01L 21/823412 327/543 |
| 2012/0175680 A1* | 7/2012 | Suh | H01L 29/1066 257/194 |
| 2012/0187452 A1* | 7/2012 | Saito | H01L 29/42316 257/192 |
| 2012/0220093 A1 | 8/2012 | Zhou et al. | |
| 2012/0224438 A1 | 9/2012 | Inaba | |

FOREIGN PATENT DOCUMENTS

| | | |
|---|---|---|
| JP | 2008311678 A | 12/2008 |
| KR | 100739658 B1 | 7/2007 |
| KR | 20110025075 A | 3/2011 |

* cited by examiner

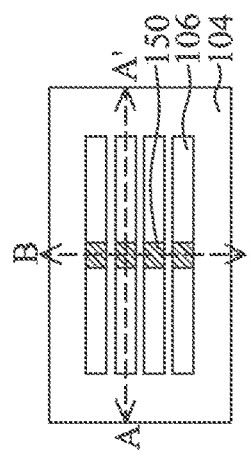 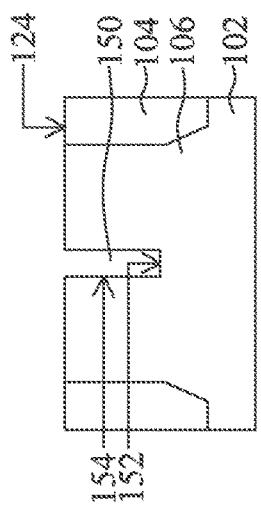 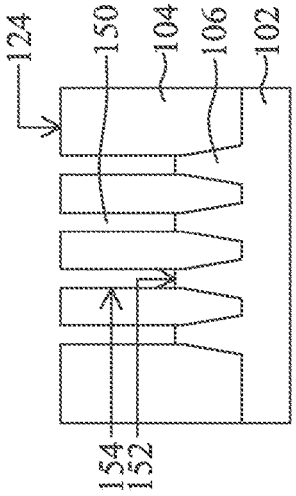
Fig. 8A  Fig. 8B  Fig. 8C
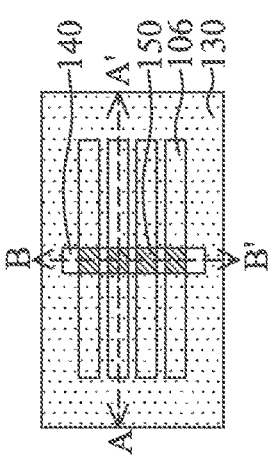 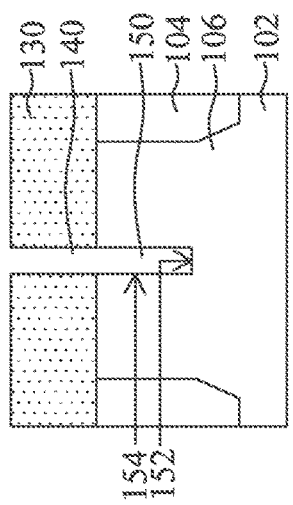 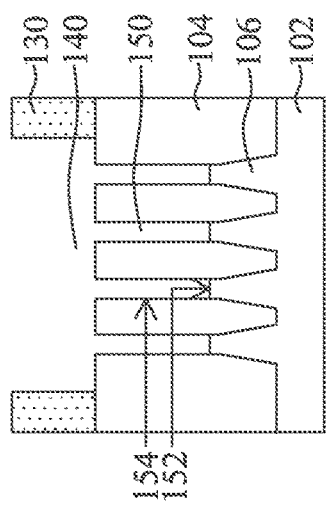
Fig. 7A  Fig. 7B  Fig. 7C

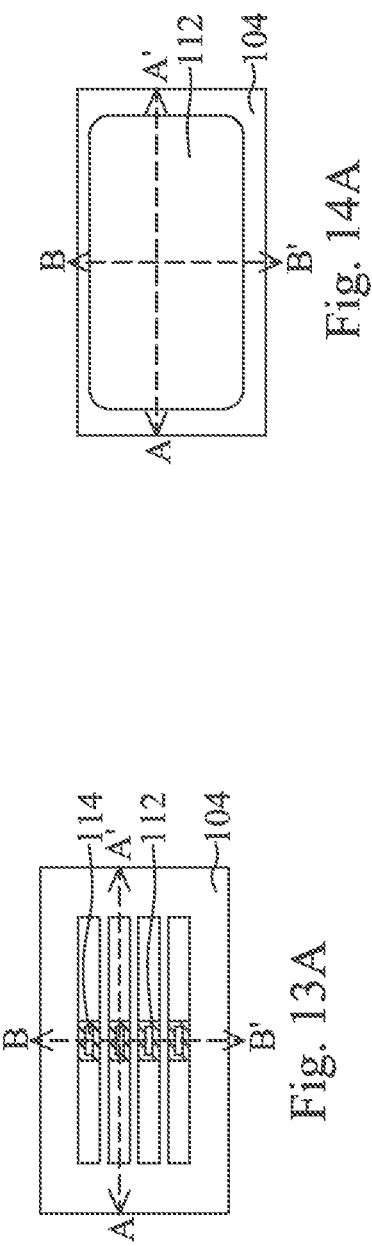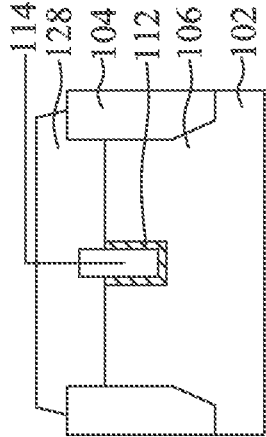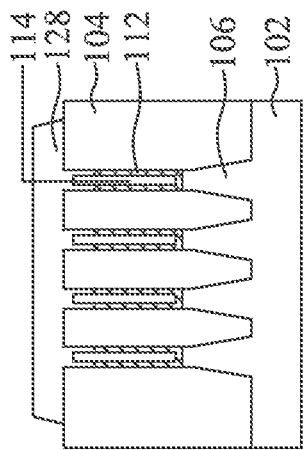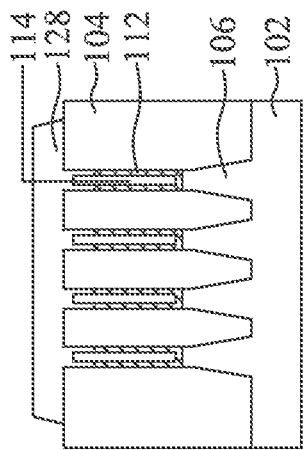

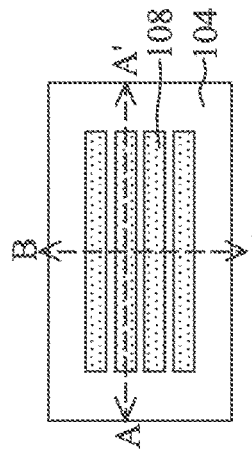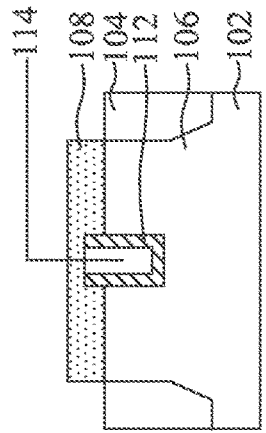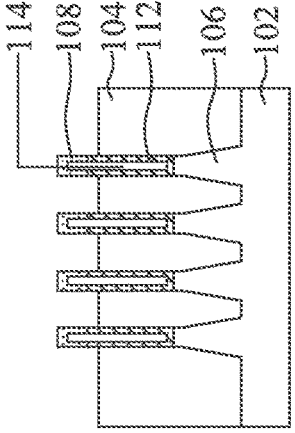
Fig. 15A  Fig. 15B  Fig. 15C
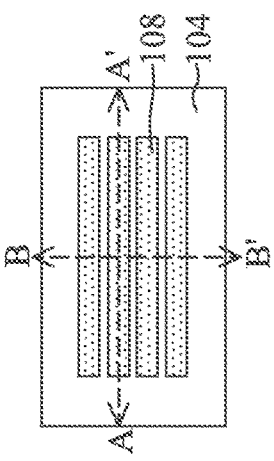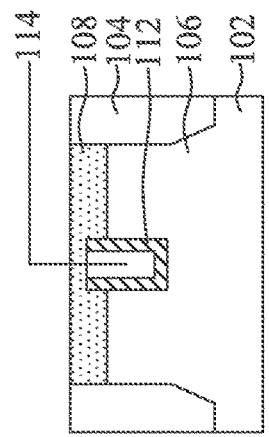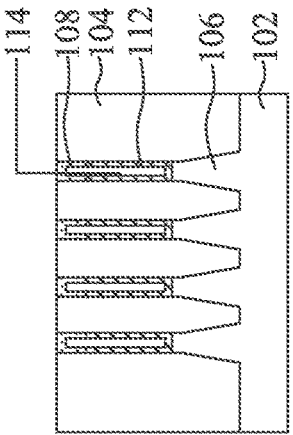
Fig. 16A  Fig. 16B  Fig. 16C

FIN STRUCTURE OF FINFET

This patent application is a continuation of U.S. patent application Ser. No. 15/263,021, filed Sep. 12, 2016, entitled "Novel Fin Structure Of FinFET," which is a continuation of U.S. patent application Ser. No. 14/793,412, filed Jul. 7, 2015, entitled "Novel Fin Structure Of FinFET," now U.S. Pat. No. 9,443,964, which is a continuation of U.S. patent application Ser. No. 13/730,518, filed Dec. 28, 2012, entitled "Novel Fin Structure Of FinFET," now U.S. Pat. No. 9,093,530, which applications are incorporated herein by reference in their entirety.

BACKGROUND

The semiconductor integrated circuit (IC) industry has experienced rapid growth. Technological advances in IC materials and design have produced generations of ICs where each generation has smaller and more complex circuits than the previous generation. In the development of new MOS (metal-oxide-semiconductor) technologies, as well as the development of three-dimensional designs such as a fin field-effect transistor (FinFET), a key aim is to improve the mobility in the channel of the device. To achieve this, the use of materials with an improved mobility when compared to silicon has been considered, for example using materials such as germanium (Ge), gallium arsenide (GaAs), or silicon germanium (SiGe) with or without additional strain. There is also a desire to allow the control of the leakage current across the channel of the device.

For example, in order to produce a SiGe device, a full sheet epitaxy of SiGe is generally formed on a silicon substrate. However, this technique results in a SiGe layer which is too thick, and thus is not compatible with thin body devices. Also, the thicker the SiGe channel, the higher the leakage current. Therefore, there is a need for forming a SiGe channel sufficiently thin to achieve the requirement of low leakage current.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-17C are top views and cross-sectional views of the FinFET 200 at various stages of fabrication according to various aspects of the present disclosure.

DETAILED DESCRIPTION

Figure 1A:
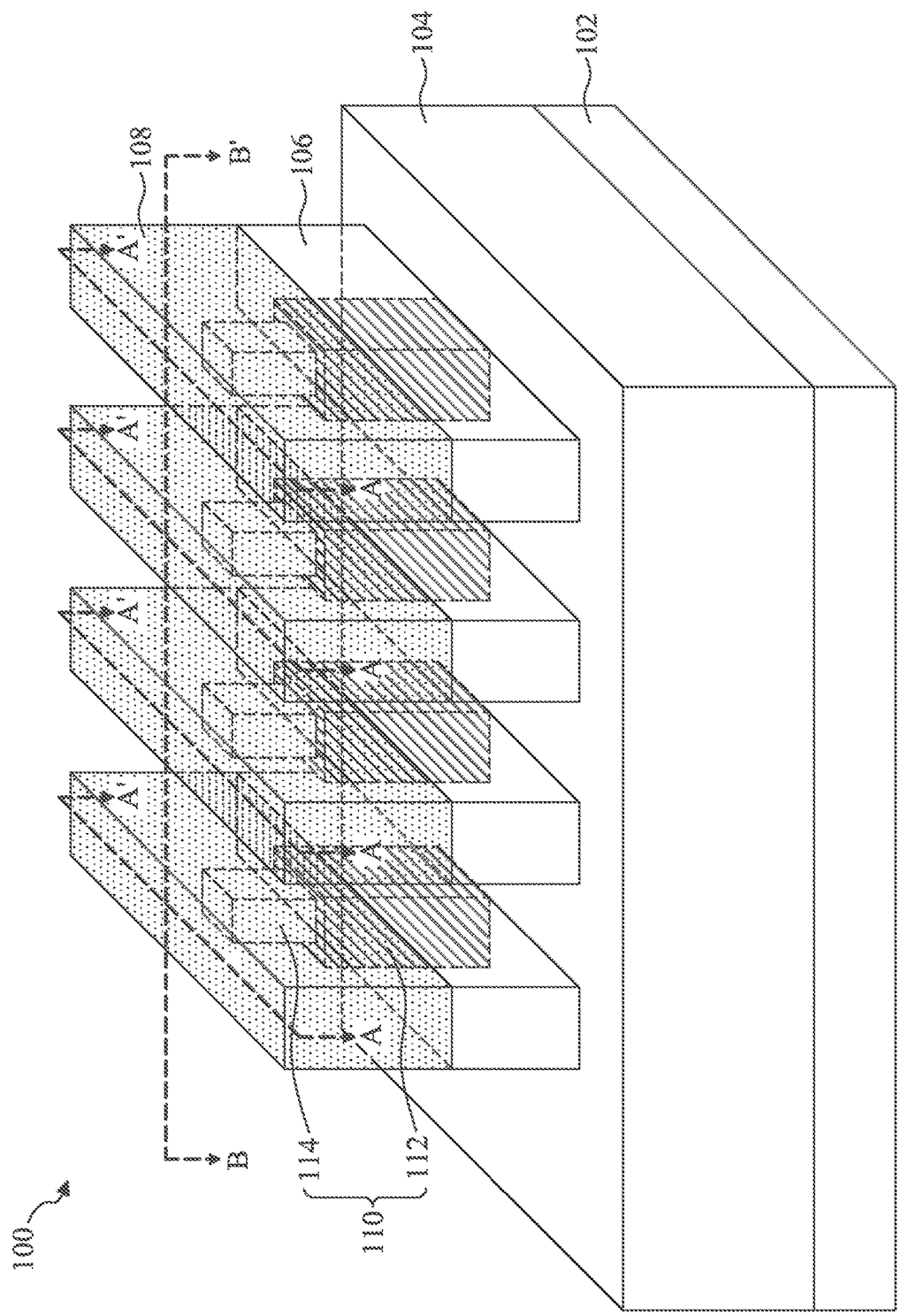
FIG. 1A is a perspective view of a fin structure 100 disposed over a substrate 102 according to various aspects of the present disclosure.

The present invention relates to the formation of a novel fin structure for a semiconductor device, and in particular to the formation of a fin field-effect transistor (FinFET).

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1B:
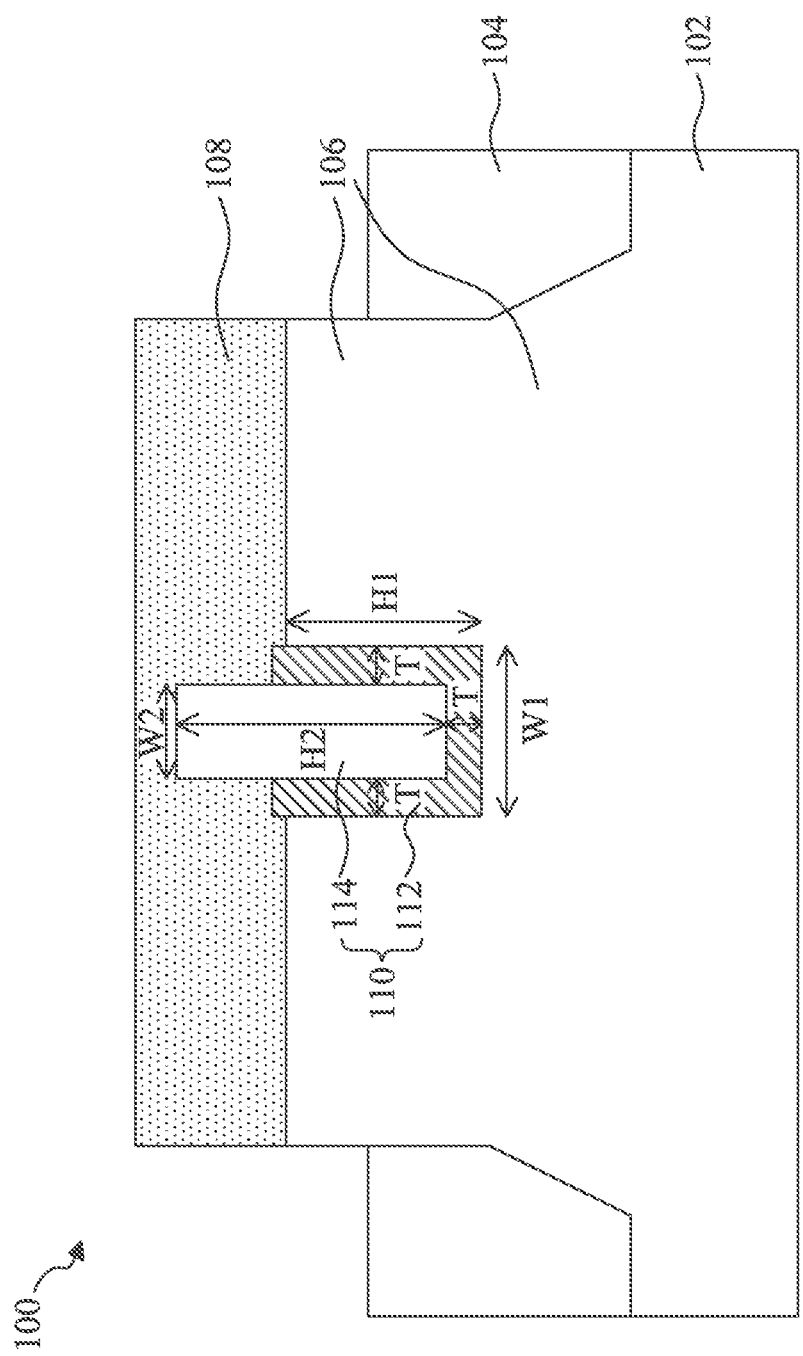
FIG. 1B is a cross-sectional view of the fin structure 100 taken along a line A-A' in FIG. 1A.
Figure 1C:
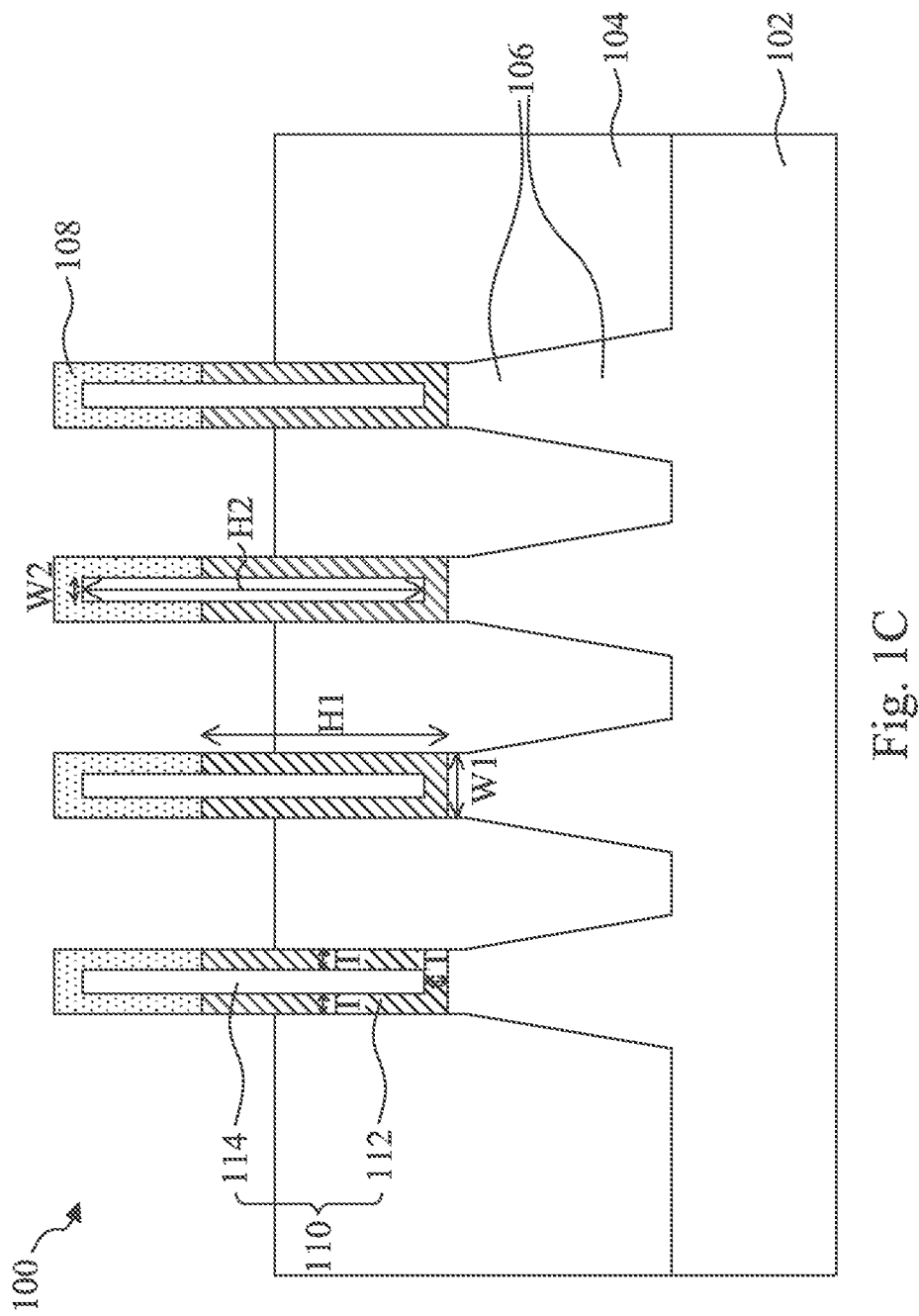
FIG. 1C is a cross-sectional view of the fin structure 100 taken along a line B-B' in FIG. 1A.

FIG. 1A is a perspective view of a fin structure 100 disposed over a substrate 102 according to various aspects of the present disclosure. In some embodiments, the fin structure 100 comprises a single fin only. In some embodiments, the fin structure 100 comprises multi fins parallel to each other and closely spaced with respect to each other, as shown in FIG. 1A. FIG. 1B is a cross-sectional view of the fin structure 100 taken along a line A-A' in FIG. 1A. FIG. 1C is a cross-sectional view of the fin structure 100 taken along a line B-B' in FIG. 1A. In at least one embodiment, the substrate 102 comprises a crystalline silicon substrate (e.g., wafer). The substrate 102 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some alternative embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 102 may include an epitaxial layer (epi-layer), may be strained for performance enhancement, and/or may include a silicon-on-insulator (SOI) structure.

As depicted in FIGS. 1A, 1B, and 1C, the fin structure 100 comprises a mesa 106, a channel 108 disposed over the mesa 106, and a convex-shaped feature 110 disposed between the channel 108 and the mesa 106. The mesa 106 may be formed from the substrate 102, or formed from a fin layer (not shown) over the substrate 102. The mesa 106 has a first semiconductor material, and the channel 108 has a second semiconductor material different from the first semiconductor material. In some embodiments, the first semiconductor material and the second semiconductor material may comprise a suitable elemental semiconductor, such as silicon, diamond, or germanium; a suitable compound semiconductor, such as gallium arsenide, silicon carbide, indium arsenide, or indium phosphide; a suitable alloy semiconductor, such as silicon germanium carbide, gallium arsenic phosphide, or gallium indium phosphide; or an epitaxial material which may be strained for performance enhancement. For example, the mesa 106 is made of silicon and the channel 108 is made of germanium or silicon germanium.

An isolation structure 104, such as a shallow trench isolation (STI), a field oxide (FOX), a local-oxidation of silicon (LOCOS) feature, and/or other suitable isolation element, is disposed between each two adjacent mesas 106. The isolation structure 104 may comprise a dielectric material such as silicon oxide, silicon nitride, silicon oxy-nitride, fluoride-doped silicate (FSG), a low-k dielectric material, combinations thereof, and/or other suitable material.

In some embodiments, the convex-shaped feature 110 is stepped-shaped, stair-shaped, or ladder-shaped. In some embodiments, the convex-shaped feature 110 comprises a first isolation feature 112 disposed between the channel 108 and the mesa 106, and a second isolation feature 114 disposed between the channel 108 and the first isolation feature 112. The first isolation feature 112 is U-shaped ("a U-shaped feature 112"). The second isolation feature 114 is rectangular-shaped ("a rectangular-shaped feature 114"). A portion of the second isolation feature 114 is surrounded by the channel 108 and another portion of the second isolation feature 114 is surrounded by the first isolation feature 112.

In some embodiments, a thickness T of the first isolation feature 112 ranges from about 1 nm to about 10 nm. In various embodiments, the thickness T ranges from about 3 nm to about 8 nm. In some embodiments, a ratio of a height H1 of the first isolation feature 112 to a width W1 of the first isolation feature 112 ranges from about 2 to about 99. In various embodiments, the ratio ranges from about 30 to about 70. For example, the height H1 ranges between about 100 nm and about 495 nm, and the width W1 ranges between about 5 nm and about 50 nm. In some embodiments, a ratio of a height H2 of the second isolation feature 114 to a width W2 of the second isolation feature 114 ranges from about 1 to about 166. In various embodiments, the ratio ranges from about 35 to about 130. For example, the height H2 ranges between about 48 nm and about 498 nm, and the width W1 ranges between about 3 nm and about 48 nm.

In some embodiments, the first isolation feature 112 has a first dielectric material, and the second isolation feature 114 has a second dielectric material different from the first dielectric material. The first dielectric material and the second dielectric material may comprise a dielectric material such as silicon oxide, silicon nitride, silicon oxy-nitride, fluoride-doped silicate (FSG), a low-k dielectric material, combinations thereof, and/or other suitable material. For example, the first dielectric material comprises nitride, and the second dielectric material comprises oxide.

The structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals.

For making it easier to compare the difference between the embodiments, the following description will detail the dissimilarities among different embodiments and the identical features will not be redundantly described.

Figure 2A:
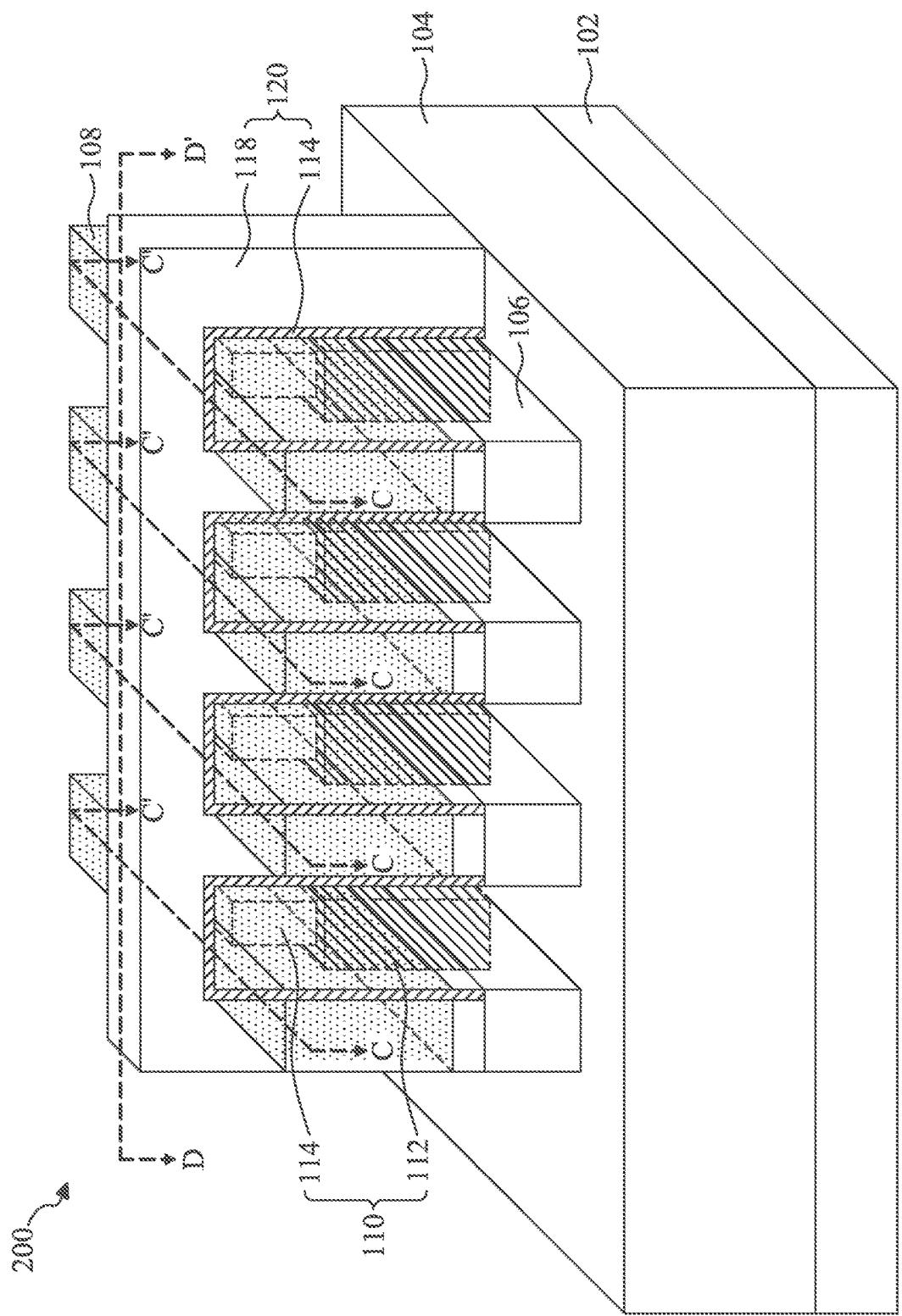
FIG. 2A is a perspective view of multiple fin field-effect transistors (FinFETs) 200 built from the fin structure 100 in FIG. 1A according to various aspects of the present disclosure.
Figure 2B:
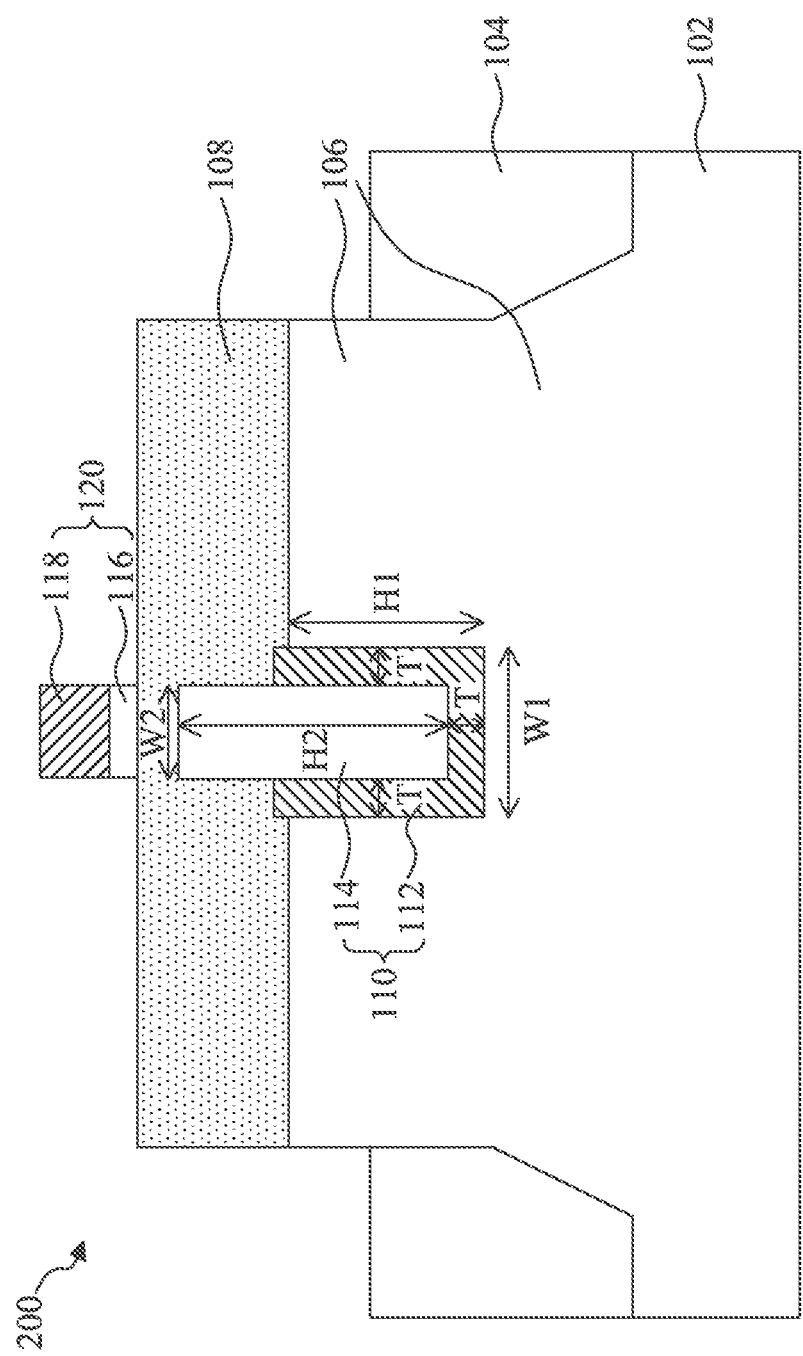
FIG. 2B is a cross-sectional view of one of the multiple FinFETs 200 taken along a line C-C' in FIG. 2A.
Figure 2C:
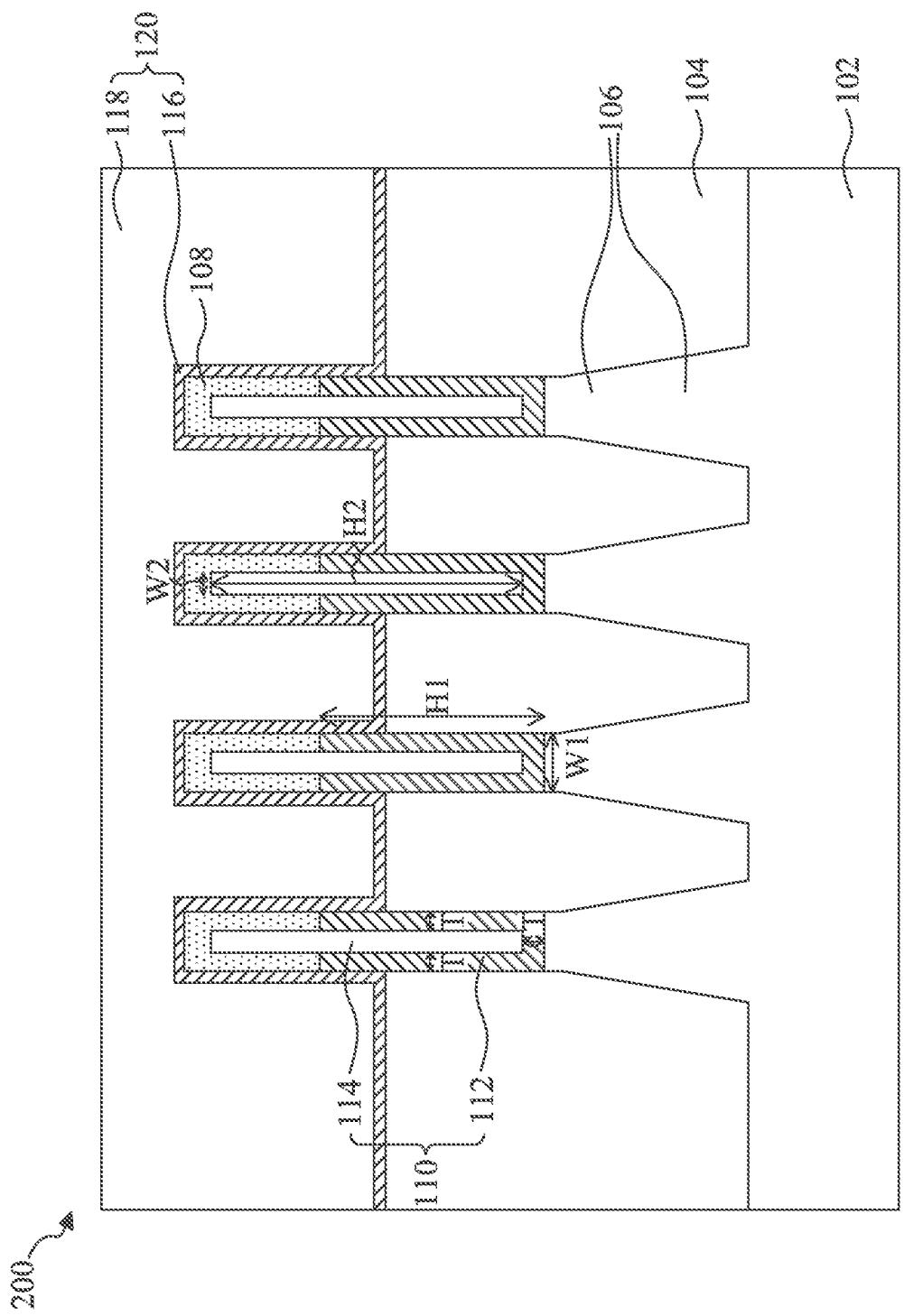
FIG. 2C is a cross-sectional view of the multiple FinFETs 200 taken along a line D-D' in FIG. 2A.

FIG. 2A is a perspective view of multiple fin field-effect transistors (FinFETs) 200 built from the fin structure 100 in FIG. 1A according to various aspects of the present disclosure. FIG. 2A is similar to FIG. 1A except that a gate structure 120 is further included. In some embodiments, only one FinFET 200 is disposed over the substrate 102. In some embodiments, multiple FinFETs 200 are disposed over the substrate 102, being parallel to each other and closely spaced with respect to each other, as shown in FIG. 2A. FIG. 2B is a cross-sectional view of one of the multiple FinFETs 200 taken along a line C-C' in FIG. 2A. FIG. 2C is a cross-sectional view of the multiple FinFETs 200 taken along a line D-D' in FIG. 2A.

As depicted in FIGS. 2A, 2B, and 2C, the FinFET 200 comprises the mesa 106, the channel 108 disposed over the mesa 106, the U-shaped feature 112 disposed between the channel 108 and the mesa 106, the rectangular-shaped feature 114 disposed between the channel 108 and the U-shaped feature 112, a gate dielectric 116 disposed over the channel 108, and a gate electrode 118 disposed over the gate dielectric 116. The mesa 106 may be formed from the substrate 102, or formed from a fin layer (not shown) over the substrate 102. The mesa 106 has a first semiconductor material, and the channel 108 has a second semiconductor material different from the first semiconductor material. The isolation structure 104 is disposed between each two adjacent mesas 106. A portion of the rectangular-shaped feature 114 is surrounded by the channel 108 and another portion of the rectangular-shaped feature 114 is surrounded by the U-shaped feature 112. The detailed description of the U-shaped feature 112 and the rectangular-shaped feature 114 in FIGS. 2A, 2B, and 2C may refer to that of the first isolation feature 112 and the second isolation feature 114 in FIGS. 1A, 1B, and 1C.

In some embodiments, the gate dielectric 116 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and/or mixtures thereof. In the present embodiment, the gate dielectric 116 is a high-k dielectric layer with a thickness in the range of about 10 angstroms (Å) to about 30 angstroms (Å). The gate dielectric 116 may be formed using a suitable process such as atomic layer deposition (ALD), chemical vapor deposition (CVD), physical vapor deposition (PVD), thermal oxidation, UV-ozone oxidation, or combinations thereof. The gate dielectric 116 may further comprise an interfacial layer (not shown) to reduce damage between the gate dielectric 116 and the channel 108. The interfacial layer may comprise silicon oxide.

In some embodiments, the gate electrode 118 may comprise a single-layer or multilayer structure. In at least one embodiment, the gate electrode 118 comprises poly-silicon. Further, the gate electrode 118 may be doped poly-silicon with the uniform or non-uniform doping. In an alternative embodiment, the gate electrode 118 comprises a metal selected from a group of W, Cu, Ti, Ag, Al, TiAl, TiAlN, TaC, TaCN, TaSiN, Mn, and Zr. In an alternative embodiment, the gate electrode 118 comprises a metal selected from a group of TiN, WN, TaN, and Ru. In the present embodiment, the gate electrode 118 has a thickness in the range of about 30 nm to about 60 nm. The gate electrode 118 may be formed using a suitable process such as ALD, CVD, PVD, plating, or combinations thereof.

The FinFET 200 may undergo further CMOS processes to form various features such as source/drain regions, contacts/vias, interconnect metal layers, dielectric layers, passivation layers, etc. Strained materials in recessed source/drain (S/D) portions of the FinFET 200 utilizing selectively grown silicon germanium may be used to enhance carrier mobility.

Figure 3:
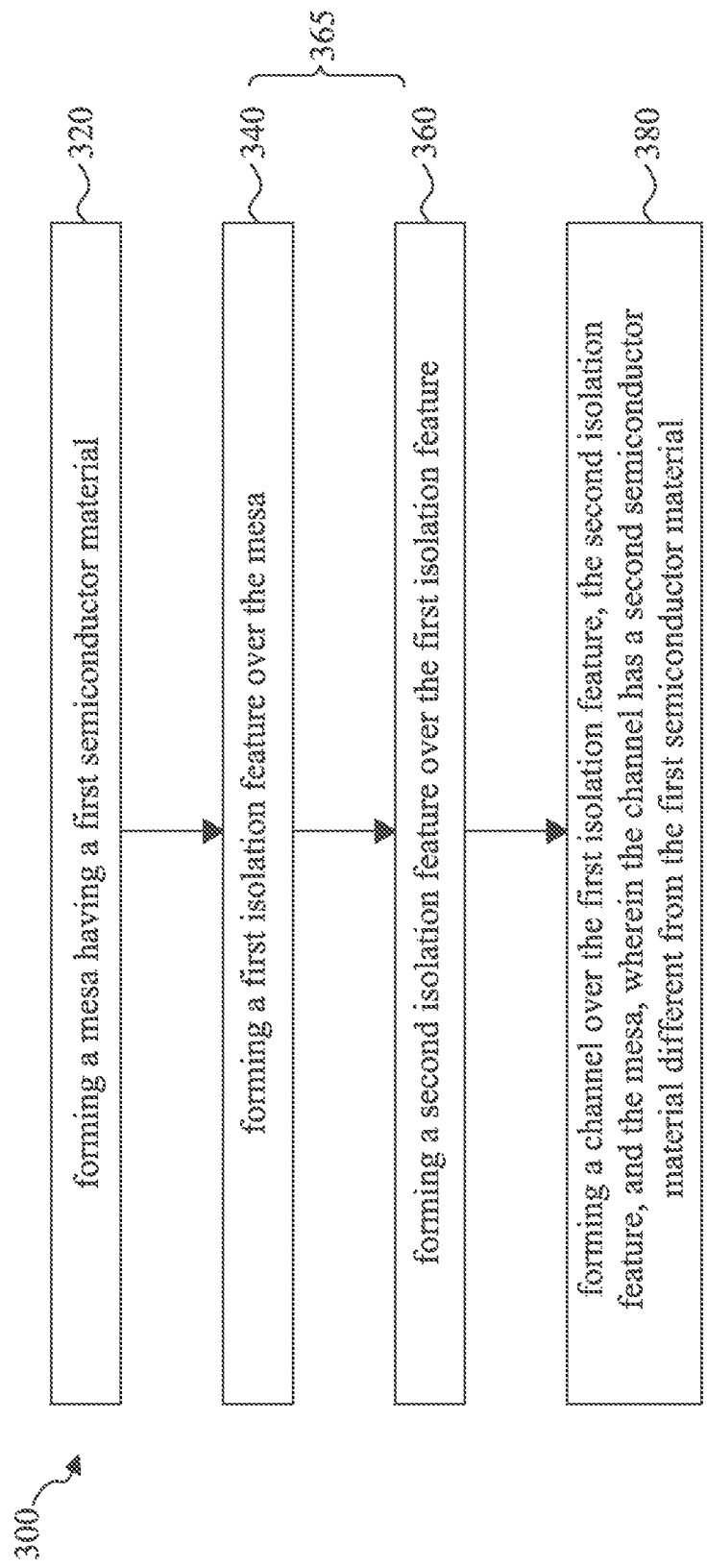
FIG. 3 is a flowchart of a method 300 of forming a fin structure 100 according to various aspects of the present disclosure.

FIG. 3 is a flowchart of a method 300 of forming a fin structure 100 according to various aspects of the present disclosure. It is understood that additional steps can be provided before, during, and after the method 300, and some of the steps described can be replaced or eliminated for other embodiments of the method. The method 300 begins at step 320 in which a mesa having a first semiconductor material is formed. The method 300 continues with step 340 in which a first isolation feature is formed over the mesa. The method 300 continues with step 360 in which a second isolation feature is formed over the first isolation feature. The method 300 continues with step 380 in which a channel is formed over the first isolation feature, the second isolation feature, and the mesa, wherein the channel has a second semiconductor material different from the first semiconductor material. The method 300 may further comprise forming a gate structure over the channel, wherein the gate structure includes a gate dielectric disposed over the channel and a gate electrode disposed over the gate dielectric. The discussion that follows illustrates embodiments of the fin structure 100 that can be fabricated according to the method 300 of FIG. 3.

Figure 4:
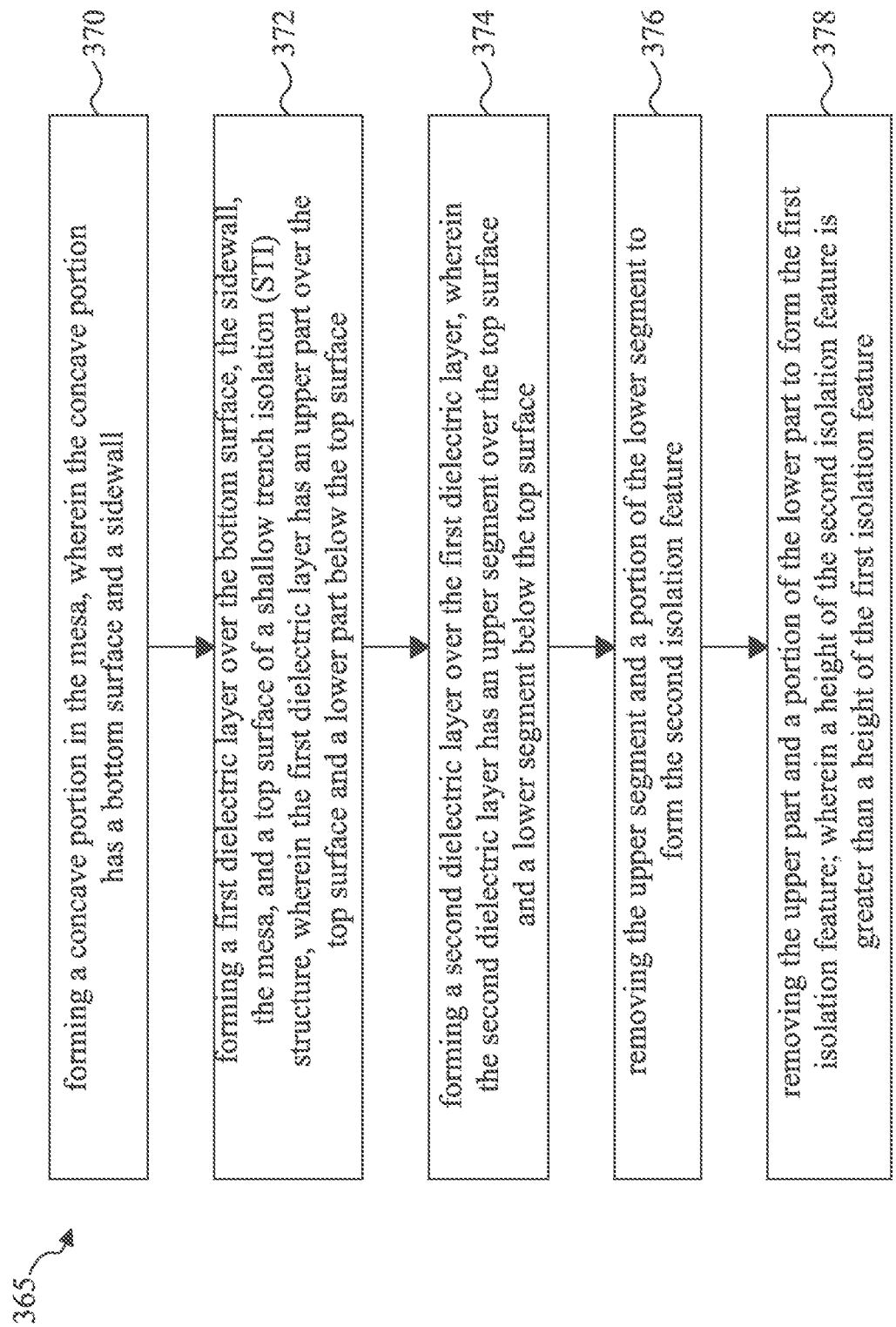
FIG. 4 is a flowchart of a sub-process 365 of forming a first isolation feature and a second isolation feature according to various aspects of the present disclosure.

Step 340 and step 360 constitute a sub-process 365. FIG. 4 is a flowchart of the sub-process 365 of forming the first isolation feature and the second isolation feature according to various aspects of the present disclosure. Reference numerals of the steps of the sub-process 365 do not necessarily indicate order of the steps. The steps may be reordered to form different method embodiments, all of which are contemplated herein. The sub-process 365 begins at step 370 in which a concave portion is formed in the mesa, wherein the concave portion has a bottom surface and a sidewall. The sub-process 365 continues with step 372 in which a first dielectric layer is formed over the bottom surface, the sidewall, the mesa, and a top surface of a shallow trench isolation (STI) structure, wherein the first dielectric layer has an upper part over the top surface and a lower part below the top surface. The sub-process 365 continues with step 374 in which a second dielectric layer is formed over the first dielectric layer, wherein the second dielectric layer has an upper segment over the top surface and a lower segment below the top surface. The sub-process 365 continues with step 376 in which the upper segment and a portion of the lower segment are removed to form the second isolation feature. The sub-process 365 continues with step 378 in which the upper part and a portion of the lower part are removed to form the first isolation feature; wherein a height of the second isolation feature is greater than a height of the first isolation feature.

FIGS. 5A-16C are top views and cross-sectional views of the fin structure 100 at various stages of fabrication according to various aspects of the present disclosure. FIGS. 5A-17C are top views and cross-sectional views of the FinFET 200 at various stages of fabrication according to various aspects of the present disclosure. As employed in the present disclosure, the fin structure 100 refers to any fin-based structure of the FinFET 200. The FinFET 200 may be included in a microprocessor, memory cell, and/or other integrated circuit (IC). It is noted that, in some embodiments, the performance of the operations mentioned in FIG. 3 does not produce a completed FinFET 200. A completed FinFET 200 may be fabricated by using complementary metal-oxide-semiconductor (CMOS) technology processing. Accordingly, it is understood that additional processes may be provided before, during, and/or after the method 300 of FIG. 3, and that some other processes may only be briefly described herein. Also, FIGS. 5A through 17C are simplified for a better understanding of the concepts of the present disclosure. For example, although the figures illustrate the fin structure 100 or the FinFET 200, it is understood an integrated circuit (IC) may comprise a number of other devices comprising resistors, capacitors, inductors, fuses, etc.

FIGS. 5A, 6A, 7A, 8A, 9A, 10A, 11A, 12A, 13A, 14A, 15A, 16A, and 17A are top views of the FinFET 200 at one of the various stages of fabrication according to an embodiment. FIGS. 5B, 6B, 7B, 8B, 9B, 10B, 11B, 12B, 13B, 14B, 15B, 16B, and 17B are cross-sectional views of the FinFET 200 taken along a line A-A' in FIGS. 5A, 6A, 7A, 8A, 9A, 10A, 11A, 12A, 13A, 14A, 15A, 16A, and 17A, respectively. FIGS. 5C, 6C, 7C, 8C, 9C, 10C, 11C, 12C, 13C, 14C, 15C, 16C, and 17C are cross-sectional views of the FinFET 200 taken along a line B-B' in FIGS. 5A, 6A, 7A, 8A, 9A, 10A, 11A, 12A, 13A, 14A, 15A, 16A, and 17A, respectively.

Figure 5A:
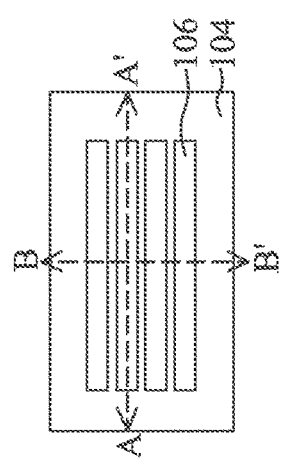
Figure 5B:
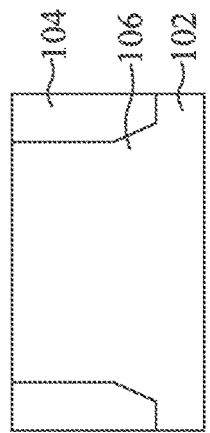
Figure 5C:
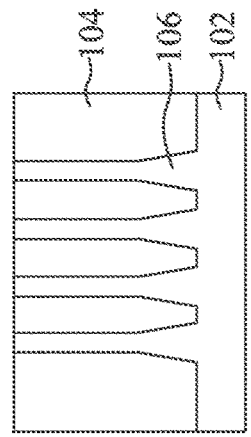

As depicted in FIGS. 5A, 5B, and 5C, and step 320 in FIG. 3, the method 300 begins at step 320 by forming a mesa 106 having a first semiconductor material over a substrate 102. The mesa 106 may be formed from the substrate 102, or formed from a fin layer (not shown) over the substrate 102. For example, the mesa 106 is made of silicon.

Figure 6A:
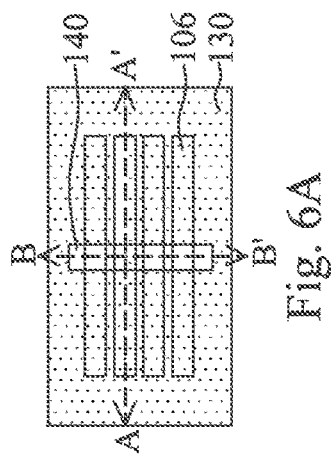
Figure 6B:
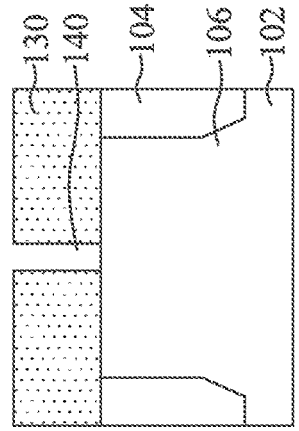
Figure 6C:
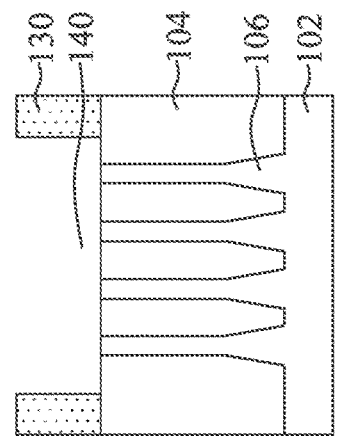

As depicted in FIGS. 6A, 6B, and 6C, a photoresist layer 130 is formed over an isolation structure 104 (e.g., a shallow trench isolation structure 104) and the mesa 106 by a suitable process, such as spin-on coating, and is then patterned by a proper lithography patterning method, forming an opening 140 in the photoresist layer 130.

As depicted in FIGS. 7A, 7B, and 7C, and step 370 in FIG. 4, the method 300 continues with step 370 by forming a concave portion 150 in the mesa 106, wherein the concave portion 150 has a bottom surface 152 and a sidewall 154. After formation of the opening 140 in the photoresist layer 130, a portion of the mesa 106 in FIGS. 6A, 6B, and 6C is then removed by an etching step to form the concave portion 150 below the opening 140. In one embodiment, the etching step may be performed by using a dry etching process, for example, the dry etching process may be performed by using a mixed gas including $HBr$, $O_2$, $Cl_2$, and $CH_4$.

As depicted in FIGS. 8A, 8B, and 8C, after formation of the concave portion 150 in the mesa 106, the photoresist layer 130 is stripped.

Figure 9A:
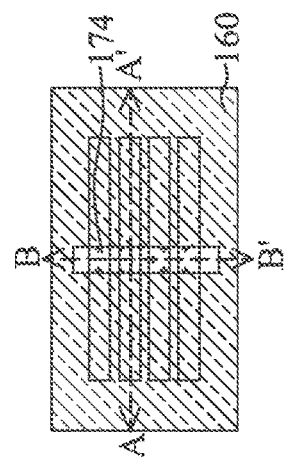
Figure 9B:
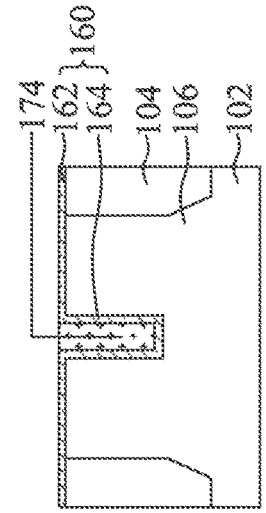
Figure 9C:
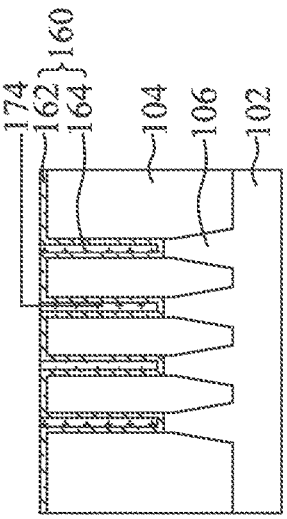
Figure 10A:
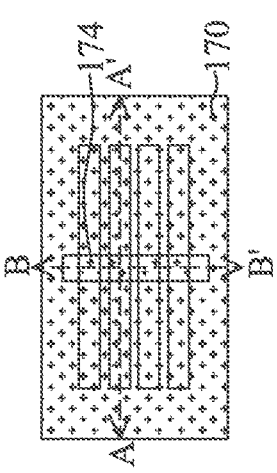
Figure 10B:
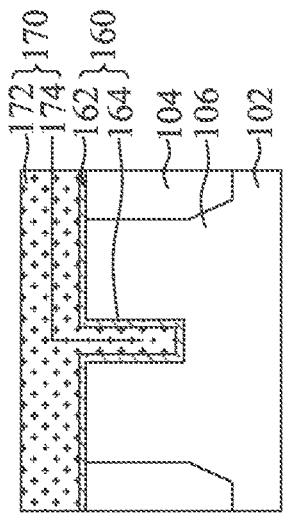
Figure 10C:
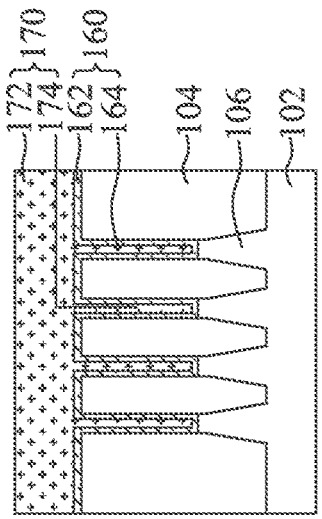

As depicted in FIGS. 9A, 9B, and 9C, and step 372 in FIG. 4, the method 300 continues with step 372 by forming a first dielectric layer 160 over the bottom surface 152, the sidewall 154, the mesa 106, and a top surface 124 of the STI structure 104, wherein the first dielectric layer 160 has an upper part 162 over the top surface 124 and a lower part 164 below the top surface 124. In some embodiments, the first dielectric layer 160 is formed of silicon nitride, for example, by using low-pressure chemical vapor deposition (LPCVD) or plasma enhanced chemical vapor deposition (PECVD).

As depicted in FIGS. 9A, 9B, and 9C, and step 374 in FIG. 4, the method 300 continues with step 374 by forming a second dielectric layer 170 over the first dielectric layer 160, wherein the second dielectric layer 170 has an upper segment 172 over the top surface 124 and a lower segment 174 below the top surface 124. The second dielectric layer 170 may be made of silicon oxide, fluoride-doped silicate glass (FSG), or a low-k dielectric material. In an embodiment, the second dielectric layer 170 may be formed by using a high-density-plasma (HDP) CVD process, using silane ($SiH_4$) and oxygen ($O_2$) as reacting precursors. In other embodiments, the second dielectric layer 170 may be formed by using a sub-atmospheric CVD (SACVD) process or high aspect-ratio process (HARP), wherein process gases may comprise tetraethylorthosilicate (TEOS) and/or ozone ($O_3$). In yet other embodiment, the second dielectric layer 170 may be formed by using a spin-on-dielectric (SOD) process, such as hydrogen silsesquioxane (HSQ) or methyl silsesquioxane (MSQ).

As depicted in FIGS. 10A, 10B, 10C, 11A, 11B, and 11C, and step 376 in FIG. 4, the method 300 continues with step 376 by removing the upper segment 172 and a portion of the lower segment 174 to form the second isolation feature 114. In some embodiments, the second dielectric layer 170 is made of silicon oxide. The removing the upper segment 172 may be performed by chemical-mechanical planarization/polishing (CMP), and the removing a portion of the lower segment 174 may be performed by an etching step. In one embodiment, the etching step may be performed by using a wet etching process, for example, by dipping the lower segment 174 of the second dielectric layer 170 in hydrofluoric acid (HF). In another embodiment, the etching step may be performed by using a dry etching process, for example, the dry etching process may be performed by using etching gases containing fluorine (F), chlorine (Cl), or bromine (Br), such as $CF_4$, $CHF_3$, $BF_3$, or $SF_6$ . . . etc.

Figure 12A:
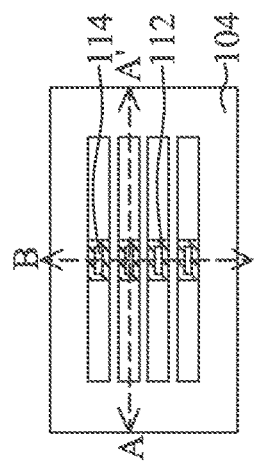
Figure 12B:
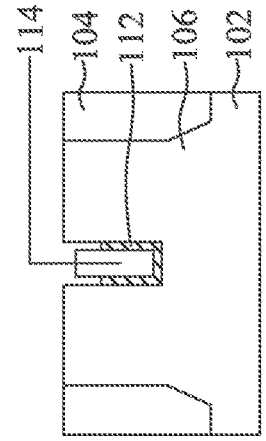
Figure 12C:
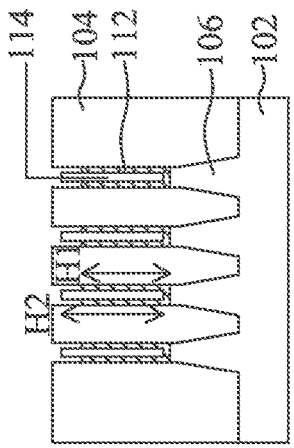
Figure 11A:
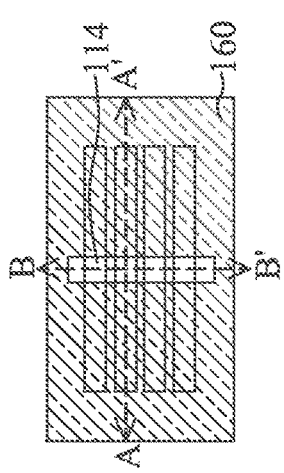
Figure 11B:
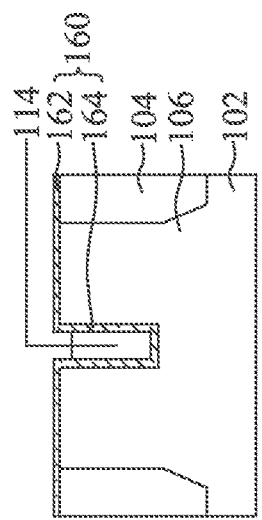
Figure 11C:
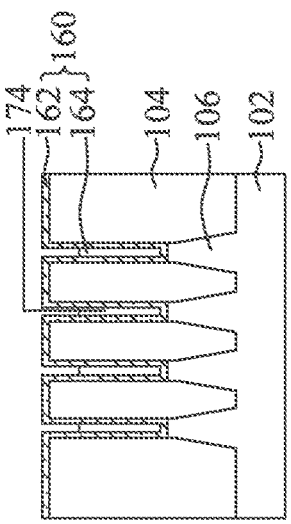

As depicted in FIGS. 12A, 12B, and 12C, and step 378 in FIG. 4, the method 300 continues with step 378 by removing the upper part 162 and a portion of the lower part 164 to form the first isolation feature 112; wherein a height H2 of the second isolation feature 114 is greater than a height H1 of the first isolation feature 112. In some embodiments, the first dielectric layer 160 is made of silicon nitride. The removing the upper part 162 and a portion of the lower part 164 may be performed by an etching step. In one embodiment, the etching step may be performed by using a wet etching process, for example, by dipping the first dielectric layer 160 in hot $H_3PO_4$. In another embodiment, the etching step may be performed by using a dry etching process, for example, with a mixed gas including a fluorine gas (e.g., $CH_3F$ or $CF_4$) and an oxygen gas (e.g., $O_2$).

As depicted in FIGS. 13A, 13B, and 13C, an upper portion of the mesa 106 is recessed by an etching step. In some embodiments, the mesa 106 is made of silicon. The etching step may use any suitable etching process including wet etching, dry etching, and/or other etching such as reactive ion etching (RIE). In one embodiment, the etching step may be performed by using a wet etching process, for example, by dipping the mesa 106 in potassium hydroxide (KOH), ethylenediamine pyrocatechol (EDP), or tetramethylammonium hydroxide (TMAH or TMAOH). In another embodiment, the etching step may be performed by using a dry etching process, for example, the dry etching process may be performed by using a mixed gas including HBr, $O_2$, $Cl_2$, and $CH_4$.

As depicted in FIGS. 14A, 14B, and 14C, a channel layer 128 is formed over the first isolation feature 112, the second isolation feature 114, and the mesa 106, wherein the channel layer 128 has a second semiconductor material different from the first semiconductor material. In some embodiments, the first semiconductor material and the second semiconductor material may comprise a suitable elemental semiconductor, such as silicon, diamond, or germanium; a suitable compound semiconductor, such as gallium arsenide, silicon carbide, indium arsenide, or indium phosphide; a suitable alloy semiconductor, such as silicon germanium carbide, gallium arsenic phosphide, or gallium indium phosphide; or an epitaxial material which may be strained for performance enhancement. For example, the channel layer 128 is made of germanium or silicon germanium.

As depicted in FIGS. 15A, 15B, and 15C, and step 380 in FIG. 3, the method 300 continues with step 380 by forming a channel 108 over the first isolation feature 112, the second isolation feature 114, and the mesa 106, wherein the channel 108 has a second semiconductor material different from the first semiconductor material. An upper portion of the channel layer 128 may be removed by CMP to form the channel 108.

As depicted in FIGS. 16A, 16B, and 16C, an upper portion of the STI structure 104 is recessed to a predetermined thickness so that the channel 108 would not be covered or surrounded by the recessed STI structure 104. Then, the fin structure 100 is formed.

Figure 17A:
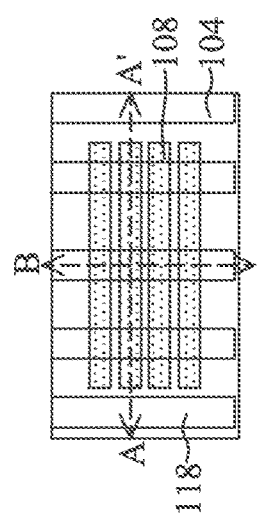
Figure 17B:
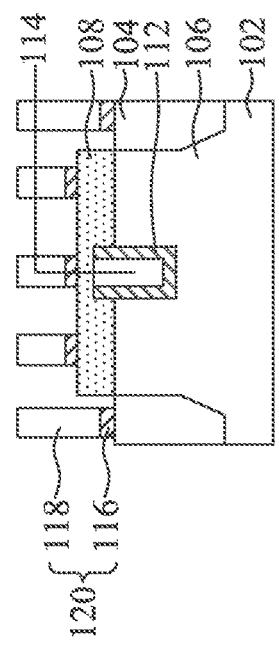
Figure 17C:
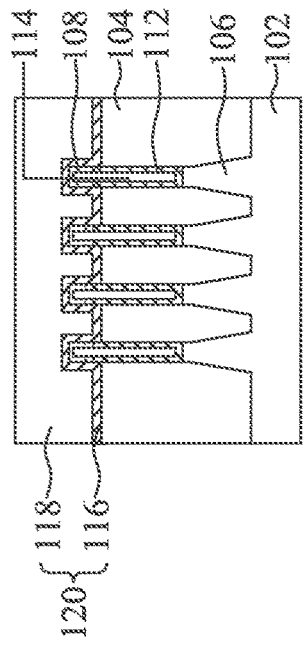

As depicted in FIGS. 17A, 17B, and 17C, the method 300 may further comprise forming a gate dielectric 116 disposed over the channel 108, and forming a gate electrode 118 disposed over the gate dielectric 116. First, a gate dielectric layer (not shown) is formed over the channel 108, the first isolation feature 112, the second isolation feature 114, the mesa 106, and the STI structure 104, and a gate electrode layer (not shown) is formed over the gate dielectric layer. Then, a layer of photoresist (not shown) is formed over the gate electrode layer by a suitable process, such as spin-on coating, and patterned to form a patterned photoresist feature (not shown) over the gate electrode layer by a proper lithography patterning method. The patterned photoresist feature can then be transferred using a dry etching process to the underlying layers (i.e., the gate dielectric layer and gate electrode layer) to form a gate structure 120 which includes the gate dielectric 116 and the gate electrode 118.

The method 300 may further comprise forming various features such as source/drain regions, contacts/vias, interconnect metal layers, dielectric layers, passivation layers, etc. Strained materials in recessed source/drain (S/D) portions of the FinFET 200 utilizing selectively grown silicon germanium may be used to enhance carrier mobility.

By using the fin structure and method of the present disclosure, the leakage current across the channel of the device is well controlled. As the channel becomes thicker, the leakage current becomes higher. By adding a convex-shaped feature disposed between the channel and the mesa, the channel thickness becomes thinner. As a result, the leakage current can be reduced by using the fin structure and method of the present disclosure.

One of the broader forms of the present disclosure involves a fin structure. The fin structure comprises a mesa having a first semiconductor material; a channel disposed over the mesa, wherein the channel has a second semiconductor material different from the first semiconductor material; and a convex-shaped feature disposed between the channel and the mesa.

In some embodiments, the convex-shaped feature is stepped-shaped, stair-shaped, or ladder-shaped.

In some embodiments, the convex-shaped feature comprises a first isolation feature disposed between the channel and the mesa, and a second isolation feature disposed between the channel and the first isolation feature.

In some embodiments, the first isolation feature is U-shaped.

In some embodiments, the second isolation feature is rectangular-shaped.

In some embodiments, a portion of the second isolation feature is surrounded by the channel and another portion of the second isolation feature is surrounded by the first isolation feature.

In some embodiments, a thickness of the first isolation feature ranges from about 1 nm to about 10 nm.

In some embodiments, a ratio of a height of the first isolation feature to a width of the first isolation feature ranges from about 2 to about 99.

In some embodiments, a ratio of a height of the second isolation feature to a width of the second isolation feature ranges from about 1 to about 166.

In some embodiments, the first isolation feature has a first dielectric material and the second isolation feature has a second dielectric material different from the first dielectric material.

In some embodiments, the first dielectric material comprises nitride.

In some embodiments, the second dielectric material comprises oxide.

Another of the broader forms of the present disclosure involves a fin field-effect transistor (FinFET). The FinFET comprises a mesa having a first semiconductor material; a channel disposed over the mesa, wherein the channel has a second semiconductor material different from the first semiconductor material; a U-shaped feature disposed between the channel and the mesa; a rectangular-shaped feature disposed between the channel and the U-shaped feature; a gate dielectric disposed over the channel; and a gate electrode disposed over the gate dielectric.

In some embodiments, a portion of the rectangular-shaped feature is surrounded by the channel and another portion of the rectangular-shaped feature is surrounded by the U-shaped feature.

In some embodiments, a thickness of the U-shaped feature ranges from about 1 nm to about 10 nm.

In some embodiments, a ratio of a height of the U-shaped feature to a width of the U-shaped feature ranges from about 2 to about 99.

In some embodiments, a ratio of a height of the rectangular-shaped feature to a width of the rectangular-shaped feature ranges from about 1 to about 166.

In some embodiments, the U-shaped feature has a first dielectric material and the rectangular-shaped feature has a second dielectric material different from the first dielectric material.

Still another of the broader forms of the present disclosure involves a method of forming a fin structure. The method comprises forming a mesa having a first semiconductor material; forming a first isolation feature over the mesa; forming a second isolation feature over the first isolation feature; and forming a channel over the first isolation feature, the second isolation feature, and the mesa, wherein the channel has a second semiconductor material different from the first semiconductor material.

In some embodiments, the forming the first isolation feature and the forming the second isolation feature comprise forming a concave portion in the mesa, wherein the concave portion has a bottom surface and a sidewall; forming a first dielectric layer over the bottom surface, the sidewall, the mesa, and a top surface of a shallow trench isolation (STI) structure, wherein the first dielectric layer has an upper part over the top surface and a lower part below the top surface; forming a second dielectric layer over the first dielectric layer, wherein the second dielectric layer has an upper segment over the top surface and a lower segment below the top surface; removing the upper segment and a portion of the lower segment to form the second isolation feature; and removing the upper part and a portion of the lower part to form the first isolation feature; wherein a height of the second isolation feature is greater than a height of the first isolation feature.

In some other embodiments, a method of forming a semiconductor device is provided. The method includes etching a substrate of a first semiconductor material to form at least one mesa of the first semiconductor material, and etching an opening in the mesa. A first insulating material is deposited on a top surface of the mesa and surfaces of the opening, and a second insulating material is deposited on the first insulating material in the opening. The first insulating material between the mesa and the second insulating material is recessed to below an uppermost surface of the second insulating material, and the mesa is recessed to below the uppermost surface of the insulating material. A channel layer is deposited on the mesa, the first insulating material, and the second insulating material, the channel layer comprising a second semiconductor material, and a gate is deposited on the channel layer above a second isolation material.

In yet other embodiments, a method of forming a semiconductor device is provided. The method includes etching a substrate of a first semiconductor material to form at least one mesa of the first semiconductor material, and etching a recess in the top surface of the mesa. A first insulating material along sidewalls of the recess, and a second insulating material is deposited in the opening along sidewalls of the first insulating material. The first insulating material is etched to remove at least a portion of the first insulating material between the first semiconductor material and the second insulating material, and the mesa is recessed below an upper surface of the second insulating material. A channel layer is deposited along sidewalls of the second insulating material, the channel layer comprising a second semiconductor material, a gate dielectric layer is formed over the channel layer, and a gate is formed over the gate dielectric layer.

In yet another embodiment, a method of forming a semiconductor is provided. The method includes recessing a substrate to form a mesa between adjacent recesses, the substrate comprising a first semiconductor material, forming a first recess in the top surface of the mesa, forming a first insulating material along sidewalls of the first recess, and forming a second insulating material over the first insulating material, the second insulating material filling the first recess. At least a portion of the first insulating material is recessed to form a second recess between the mesa and the second insulating material, and the top portion of the mesa is removed such that at least a portion of the second insulating material extends above an upper surface of the mesa. A channel layer is formed on the second insulating material, the channel layer including a second semiconductor material, a gate insulating layer is formed over the channel layer, and a gate is formed on the gate insulating layer.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
a dielectric structure;
a semiconductor structure over the dielectric structure; and
a gate structure extending over the semiconductor structure and the dielectric structure, the semiconductor structure comprising a continuous layer of semiconductor material, the continuous layer of semiconductor material having a first thickness below the gate structure and a second thickness on opposing sides of the gate structure, the first thickness being less than the second thickness, the dielectric structure extending lower than a bottommost surface of the semiconductor structure.

2. The semiconductor device of claim 1, wherein the dielectric structure comprises a first dielectric layer and a second dielectric layer over the first dielectric layer.

3. The semiconductor device of claim 2, wherein the first dielectric layer extends along sidewalls of the second dielectric layer.

4. The semiconductor device of claim 3, wherein the second dielectric layer extends closer to an upper surface of the gate structure than the first dielectric layer.

5. The semiconductor device of claim 4, wherein a ratio of a vertical height of the first dielectric layer to a lateral width of the first dielectric layer is between 30 and 70.

6. The semiconductor device of claim 5, wherein a ratio of a vertical height of the second dielectric layer to a lateral width of the second dielectric layer is between 35 and 130.

7. The semiconductor structure of claim 1, further comprising an underlying semiconductor material, wherein the semiconductor structure is over the underlying semiconductor material, the underlying semiconductor material extending along sidewalls of the dielectric structure.

8. A semiconductor structure comprising:
a first semiconductor layer;
a first isolation region extending into the first semiconductor layer;
a second semiconductor layer over the first semiconductor layer and the first isolation region, the second semiconductor layer surrounding the first isolation region in a plan view; and
a gate electrode extending along sidewalls of the second semiconductor layer, wherein the gate electrode laterally overlaps the first isolation region.

9. The semiconductor structure of claim 8, further comprising a second isolation region completely separating the first isolation region from the first semiconductor layer.

10. The semiconductor structure of claim 9, wherein the second isolation region extends into the first semiconductor layer.

11. The semiconductor structure of claim 9, wherein sidewalls of the second isolation region are aligned with sidewalls of the second semiconductor layer.

12. The semiconductor structure of claim 9, wherein the second isolation region completely surrounds the first isolation region in a plan view.

13. The semiconductor structure of claim 9, wherein a thickness of the second isolation region is between 1 nm and 10 nm.

14. The semiconductor structure of claim 8, wherein the first semiconductor layer and the second semiconductor layer comprise different materials.

15. A semiconductor structure comprising:
an isolation region;
a first semiconductor material, the isolation region extending into the first semiconductor material;
a second semiconductor layer over the first semiconductor material, the second semiconductor layer extending over a top surface and sidewalls of the isolation region, the second semiconductor layer having source/drain regions on opposing sides of a channel region, wherein a thickness of the second semiconductor layer in the channel region is less than a thickness of the second semiconductor layer in the source/drain regions; and
a gate electrode extending over the channel region of the second semiconductor layer.

16. The semiconductor structure of claim 15, wherein the isolation region comprises:
a first dielectric layer; and
a second dielectric layer over the first dielectric layer.

17. The semiconductor structure of claim 16, further comprising shallow trench isolation regions on opposing sides of the first semiconductor material.

18. The semiconductor structure of claim 17, wherein the second dielectric layer extends above an uppermost surface of the shallow trench isolation regions.

19. The semiconductor structure of claim 18, wherein the first dielectric layer extends above the uppermost surface of the shallow trench isolation regions.

20. The semiconductor structure of claim 16, wherein the first dielectric layer extends along a bottom surface and sidewalls of the second dielectric layer.

* * * * *